United States Patent
Falk et al.

(10) Patent No.: US 7,463,489 B2
(45) Date of Patent: Dec. 9, 2008

(54) POWER INVERTER

(75) Inventors: Andreas Falk, Kassel (DE); Nafiz Yasat, Paderborn (DE)

(73) Assignee: SMA Solar Technology AG, Niestetal (DE)

( * ) Notice: Subject to any disclaimer, the term of this patent is extended or adjusted under 35 U.S.C. 154(b) by 56 days.

(21) Appl. No.: 11/788,341

(22) Filed: Apr. 19, 2007

(65) Prior Publication Data

US 2007/0247823 A1    Oct. 25, 2007

(30) Foreign Application Priority Data

Apr. 22, 2006  (DE) .................. 10 2006 018 854

(51) Int. Cl.
*H05K 7/20* (2006.01)

(52) U.S. Cl. .................. 361/719; 361/704; 361/721; 174/252

(58) Field of Classification Search .................. None
See application file for complete search history.

(56) References Cited

U.S. PATENT DOCUMENTS

| | | | |
|---|---|---|---|
| 5,946,192 A | 8/1999 | Ishigami et al. | |
| 5,966,291 A * | 10/1999 | Baumel et al. | 361/707 |
| 6,272,015 B1 * | 8/2001 | Mangtani | 361/707 |
| 6,661,659 B2 * | 12/2003 | Tamba et al. | 361/699 |
| 6,704,202 B1 | 3/2004 | Hamoka et al. | |
| 6,724,631 B2 * | 4/2004 | Ye et al. | 361/719 |
| 6,771,507 B1 * | 8/2004 | Belady et al. | 361/704 |
| 7,081,691 B2 * | 7/2006 | Kawata | 307/9.1 |
| 7,206,204 B2 * | 4/2007 | Nakatsu et al. | 361/703 |
| 2004/0100778 A1 | 5/2004 | Vinciarelli et al. | |
| 2006/0044762 A1 * | 3/2006 | Kikuchi et al. | 361/704 |

FOREIGN PATENT DOCUMENTS

| | | |
|---|---|---|
| DE | 100 48 379 A1 | 4/2001 |
| JP | 10227489 | 8/1998 |
| JP | 11113267 A | 4/1999 |
| JP | 2005123459 A | 5/2005 |

\* cited by examiner

*Primary Examiner*—Boris L Chervinsky
(74) *Attorney, Agent, or Firm*—Thomas R. Vigil

(57) ABSTRACT

The object of the invention is a power inverter, the bottom of the housing (1) of the power inverter being configured to be stepped, cooling bodies (10, 11) being disposed on the exterior face of the stepped bottom, at least two printed circuit boards (6, 8) that overlap each other and communicate with the respective one of the cooling bodies (10, 11) through semiconductor components being provided.

10 Claims, 3 Drawing Sheets

POWER INVERTER

FIELD OF THE INVENTION

The invention relates to a power inverter.

DESCRIPTION OF THE PRIOR ART

An electronic control unit for controlling the engine of an automotive vehicle is known from DE 100 48 379 A1. The control unit consists of a housing with a housing bottom that is configured to be a radiation plate or heat sink. Power transistors are disposed on this housing bottom. Thereabove, there is located a printed circuit board that comprises a CPU or a microcomputer and that divides the housing.

The JP 2005123459 describes a cooling body having a tube inside, said tube projecting from the cooling body and exhibiting cooling ribs at its protruding ends. On said cooling body there are located heat generating semiconductor components. In the evacuated tube, there remains a small amount of liquid that evaporates in the tube under the action of heat. Since the tube is disposed at an incline, the vapor ascends in the direction of the tube section provided with the cooling ribs and condenses there before returning to the lower end point of the tube where the cooling circuit starts all over again.

Power inverters are known from many fields in electrical engineering, more specifically from photovoltaic applications, but also from other alternative electricity generating appliances such as wind power plants and also biogas plants. Battery power inverters are further needed for providing, from a battery acting as the source of energy, an AC network for consumers that are not connected to the public mains. Such type power inverters serve to convert direct current into alternating current. For this purpose, switching elements, more specifically semiconductor components such as AC/DC converters, are needed and also, depending on the circuit topology, magnetic components such as transformers or chokes.

In order to reduce the weight of such type current converters, HF topologies with HF transformers are increasingly utilized in prior art. A plurality of power electronic conversion stages are thereby connected one behind the other. As a result, a plurality of power semiconductors needs to be cooled at various locations in the circuit. According to prior art, the semiconductors are e.g. disposed as modules on the underside of the associated printed circuit boards.

A power inverter, which has no housing though, is known from JP 11113267. The power inverter exhibits a stepped cooling body, each step comprising a power inverter bridge circuit. The bridge circuits are connected to a printed circuit board located thereabove. This reference does not disclose a space-saving configuration.

Power inverters are often utilized on the outside of buildings. This means that the housings must be weather- and water-proof. Such a weather-proof housing of a prior art power inverter is for example characterized in that the housing itself is hermetically sealed against environmental effects but that it has cooling ribs on its outer face. In order to prevent the components disposed in the housing, such as semiconductor components and also magnetic components such as transformers and chokes, from overheating, a fan is located in the housing for continuously circulating the air in the housing. The heat generated in operation of the power inverter is delivered to the ambient air via the housing and the cooling ribs disposed on said housing.

Such a power inverter architecture has various disadvantages; cooling in particular is only conditionally sufficient, this causing, the power inverter to switch off prematurely because of overheating, in particular when the outside temperatures are high. Furthermore, a fan is a part that is subject to wear. Since the cooling ribs are disposed about the entire circumference of the housing, the housing side turned toward the operator also becomes very hot so that there is a risk of damage to the operator. The heat developing in the components disposed in the current inverter housing is particularly relevant when they operate in the low frequency range. The reason therefore is that they need a big transformer, which generates heat in an amount corresponding to its size, this heat having eventually to be delivered to the outside via the housing.

Furthermore, such type low-frequency power inverters are quite voluminous, so that there is a need for additional space for mounting them to a housing part.

Other prior art power inverters with HF topology comprise one or more printed circuit boards on which a plurality of side-by-side semiconductors are cooled by a cooling body. The disadvantage of such architecture is that it has a large base area.

BRIEF SUMMARY OF THE INVENTION

It is therefore the object of the invention to provide a housing of a power inverter that is weather- and more particularly water-proof, needs a small base area whilst still allowing for sufficient cooling of the components of the power inverter, even at high outside temperatures. The advantage of a small base area is that only a small wall area is needed for hanging the inverter in an electrical service room. Also, touchable housing parts must not become hot. Meaning, it is intended to provide a housing of a power inverter that combines actually completely different construction principles, namely a compact construction and optimum cooling.

According to a first embodiment of a power inverter, the solution the invention provides to this object is that the bottom of the housing is stepped, with the cooling bodies being disposed on the exterior face of the stepped bottom, at least two printed circuit boards that overlap each other and communicate with the respective one of the cooling bodies through semiconductor components being provided. The stepped configuration of the housing body allows for arranging the printed circuit boards in such a manner that they are also staggered stepped with respect to each other and overlap each other so that a construction with the smallest possible base area is realized. The overlapping arrangement of the printed circuit boards results in a space-saving construction. By having the cooling body disposed outside of the housing, here more specifically between the wall of an electrical service room for example and the housing, one not only achieves sufficient cooling but also that the cooling body is not readily accessible from the outside.

Since the printed circuit board communicates with a cooling body and since the size of the cooling body is chosen according to the stepped design of the housing bottom, it is possible to utilize cooling bodies of different heights and, as a result thereof, of different sizes, insofar as a large cooling body can be inserted into the stepped recess of the housing bottom whilst the cooling body can be flatter in the other portion of the housing bottom. This also takes into consideration that printed circuit boards of different sizes are utilized, the larger printed circuit board being disposed above the smaller printed circuit board in the housing of the power inverter so that the larger cooling body is also associated to the larger printed circuit board. This means that the height of the cooling bodies on the stepped bottom is chosen to allow the rib sides of the cooling bodies to form a plane in the mounted condition in spite of the fact that the cooling bodies have differing heights.

According to a second variant, there is provided, in accordance with the invention, to accomplish above object in that the power inverter is provided with at least one cooling body disposed outside the housing and with at least two printed circuit boards that communicate through semiconductor components with the at least one cooling body, the one printed circuit board, which is inclined, overlapping the other printed circuit board in the housing.

More specifically, the inclined printed circuit board is connected to the at least one cooling body through a ramp. The ramp constitutes a heat conducting block having an inclined reception area, the semiconductor component being preferably provided between the ramp and the printed circuit board.

Further advantageous features of the variants will become apparent from the dependent claims.

There is provided that the at least one cooling body comprises means for fastening the cooling body to the housing part.

According to a particular feature of the invention, there is provided that the cooling body or bodies are arranged laterally offset on the bottom of the housing when viewed from the front. The advantage is that this allows for optimizing the dissipation of the heat generated by the cooling bodies.

This insofar as fresh air is circulated around every single cooling body. Through the lateral offset of the cooling bodies on the bottom of the housing on the exterior face of the housing body, space is further made available for the arrangement of other elements or units to be cooled such as chokes that can be mounted on the housing beside the cooling bodies on the exterior face of the bottom. Although, depending on where such type elements to be cooled such as chokes are disposed, these elements are exposed to the preheated air through the cooling body located underneath, the cooling effect is in many cases sufficient to ensure faultless operation of these elements as well.

There is further provided that the printed circuit boards communicate with the respective one of the cooling body through the semiconductor components.

As already explained above, the power inverters are preferably utilized on the outside, i.e., the power inverters are exposed to environmental impacts, to moisture in particular. This means that the power inverter housings must be configured so as to prevent moisture from penetrating, in particular in the region of the cable passageways. Insofar, there is provided that the housing of the invention comprises on its underside, in the mounted condition, what is termed a connection region for one or more electric cables. There is more specifically provided that the connection region has an inclined wall with a sealable passageway for the incoming cables. In this context, it should be noted that, in battery power inverters for small battery voltages, the cables that are introduced into the connection region are very thick and quite stiff. This means that the battery lines should be inserted into the connection region, e.g., in the form of a connection chamber, in the prescribed direction in order to prevent the battery lines from bending excessively and, as a result thereof, to prevent the seals in the wall of the connection housing from being subjected to corresponding bending loads. Insofar, the wall for passage of the battery lines is configured to be inclined when viewed from the side of the housing. This incline concurrently serves as a nozzle for injecting cool air towards the cooling bodies located on the underside.

According to another feature of the invention, the connection region exhibits at least one pole block, which is for example configured to be a copper bar, with a plurality of terminals for receiving the outgoing and the incoming electric cables. More specifically there are provided at least two pole blocks, each pole block being connected to cables supplied from the outside through the connection region, the other terminals of such a pole block serving to receive individual cables for connection with the corresponding connections on the printed circuit board. The advantage thereof is that the thick cable or wiring harness of the battery lines, which is very stiff and is introduced into the connection region, is difficult to seal in the transition area to the connection region, but that the transition of the individual cable from the respective one of the pole blocks to the actual power inverter housing is better to seal thanks of the higher elasticity of these thinner cables. For it has to be made certain that the power inverter housing is completely protected against penetrating moisture, the connection region, by contrast, only needing rough protection since there are no moisture-sensitive electric components located there. Further, the splitting into a plurality of lines allows for supplying a higher battery current to the printed circuit board without the contact pad becoming too hot.

The invention with the two variants will be better understood upon reading the following description given by way of example with reference to the drawings.

DETAILED DESCRIPTION OF THE INVENTION

Figure 1:
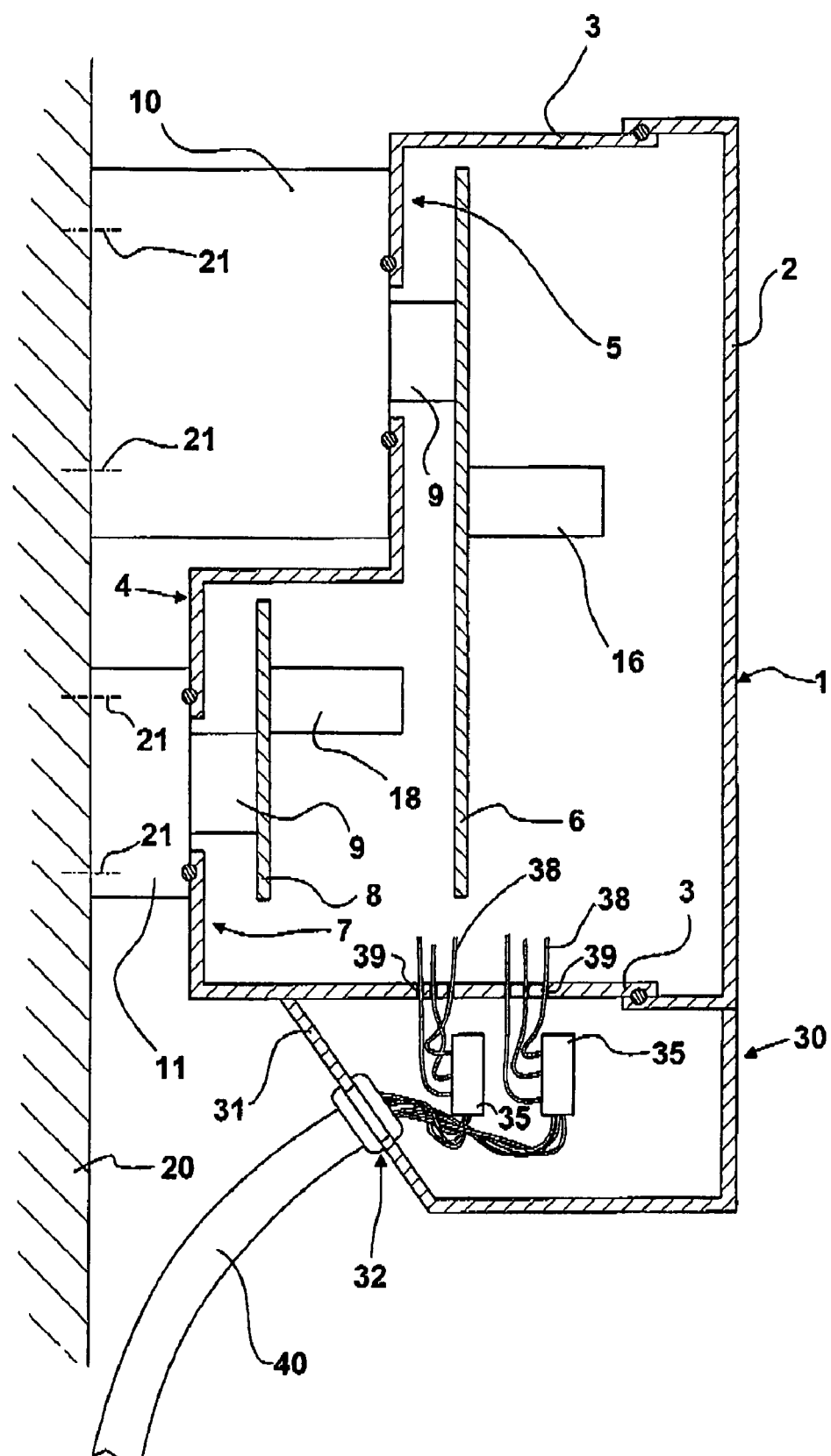
FIG. 1 shows the power inverter housing of a first variant in a side view.

According to the first variant, the power inverter housing indicated generally at 1 includes a cover 2, a wall 3 as well as the stepped bottom indicated at 4. In the region of step 5, which is the top step in FIG. 1, there is located the printed circuit board indicated at 6 whilst the printed circuit board indicated at 8 is disposed in the region of step 7. The printed circuit boards 6 and 8 are each connected to a respective cooling body 10 and 11 through the semiconductor components 9, said cooling bodies 10 and 11 having differing heights. The printed circuit boards 6 and 8 further show other components, for example magnetic components or capacitors 16 and 18. As compared to the printed circuit board 6, the printed circuit board 8 has a greater extension. In the mounted condition, the cooling bodies have on their underside, meaning on the side turned toward the wall 20, a plane so that the housing may be mounted generally planar to the wall. The power inverter housing is mounted to the wall 20 using screws 21 that are outlined in the Fig.

Figure 2:
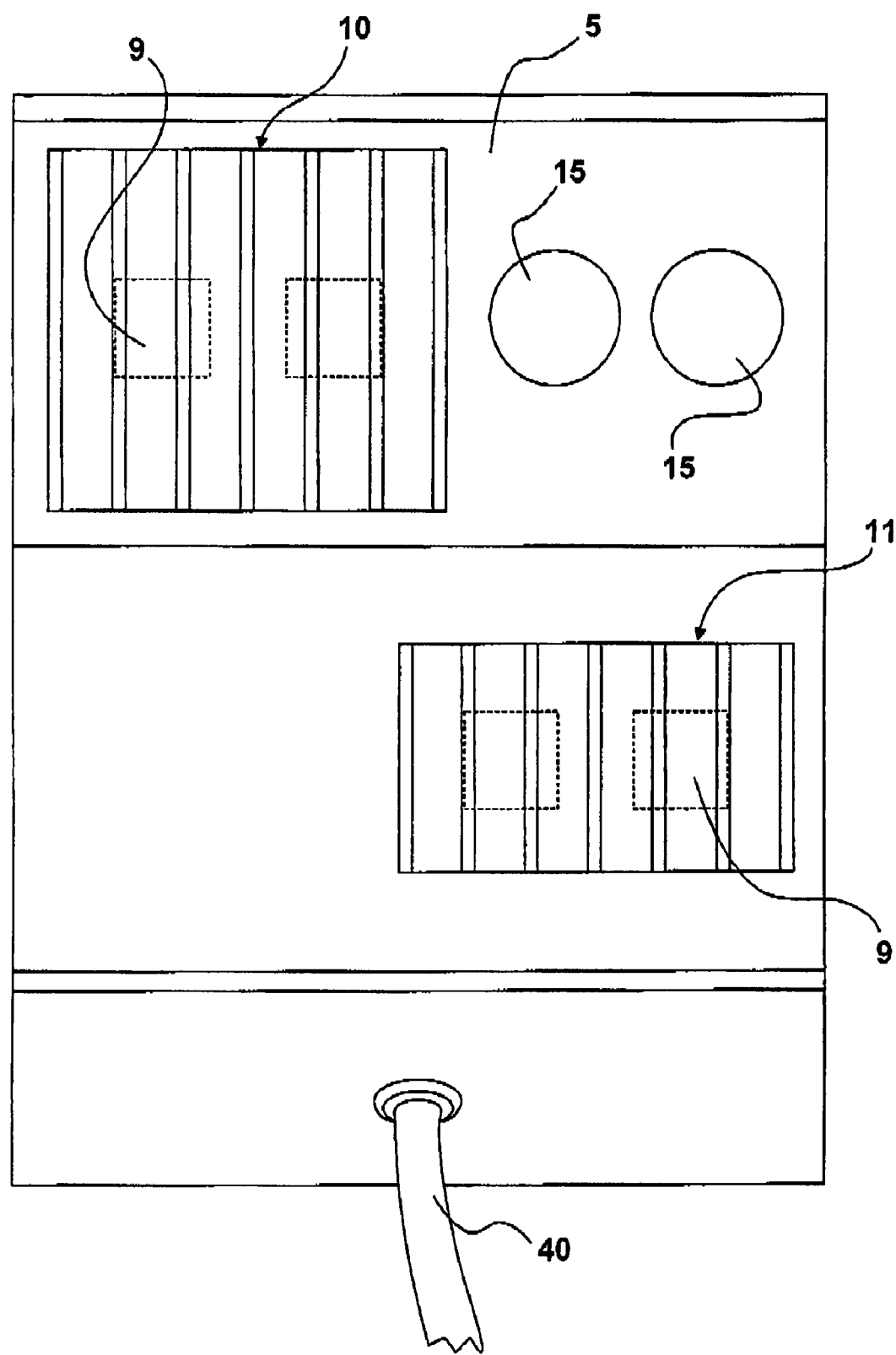
FIG. 2 shows a view of the power inverter housing taken along the line II-II of FIG. 1.

As can be seen from FIG. 2 in particular, the cooling bodies 10 and 11 are disposed in a staggered side-by-side arrangement on the exterior face of the bottom 4. This means that air flows by convection through each cooling body 10, 11 separately. By having the cooling bodies disposed on the outside, a natural convection, and as a result thereof optimum cooling, is made possible whilst the housing otherwise remains tight. The arrangement of the cooling bodies on the exterior face of the bottom 4 allows further that the hot cooling bodies are not accessible from the outside so that there is no risk of injury to the operating staff.

As already explained above, the cooling bodies are arranged laterally offset with respect to each other on the bottom 4 of the housing. As a result, there is space left for mounting other units to be cooled, for example chokes 15 that are disposed in the region of the step 5. Although these are cooled with the air already heated by the cooling body 11, this cooling effect is still sufficient to ensure operation of these chokes, even if the environment is warm.

The object of the invention also is the arrangement of a connection region 30 in the form of a connection chamber on the housing indicated at 1. This connection region or connection chamber includes an inclined wall 31 that is directed toward the wall 20 of the building, said inclined wall 31 having an opening 32 allowing for passage of the bundle of battery lines indicated at 40. By having the wall 31 arranged in the direction of the wall 20 of the building, the passageway for the battery cable 40 is protected against direct weather elements. In the region of the connection chamber 30, there are two pole blocks 35, the cable of the cable harness 40 being connected to these pole blocks 35 through corresponding terminals, each pole block having additional terminals, the outgoing, relatively thinner cables 38 being passed through the wall 3 of the housing 1 of the power inverter into the interior of the housing. These different cables 38 are sealed in the region of the passageway through the wall 3 with a rubber collar 39. It should be noted here that it is much easier to seal various thin cables than one thick cable or cable harness since the thin cables are much more elastic than a thick cable or an entire cable harness. The connection chamber or the connection region 30 itself is also sealed against penetrating moisture, but its tightness cannot be ensured like in the transition from the connection chamber 30 into the housing 1.

Figure 3:
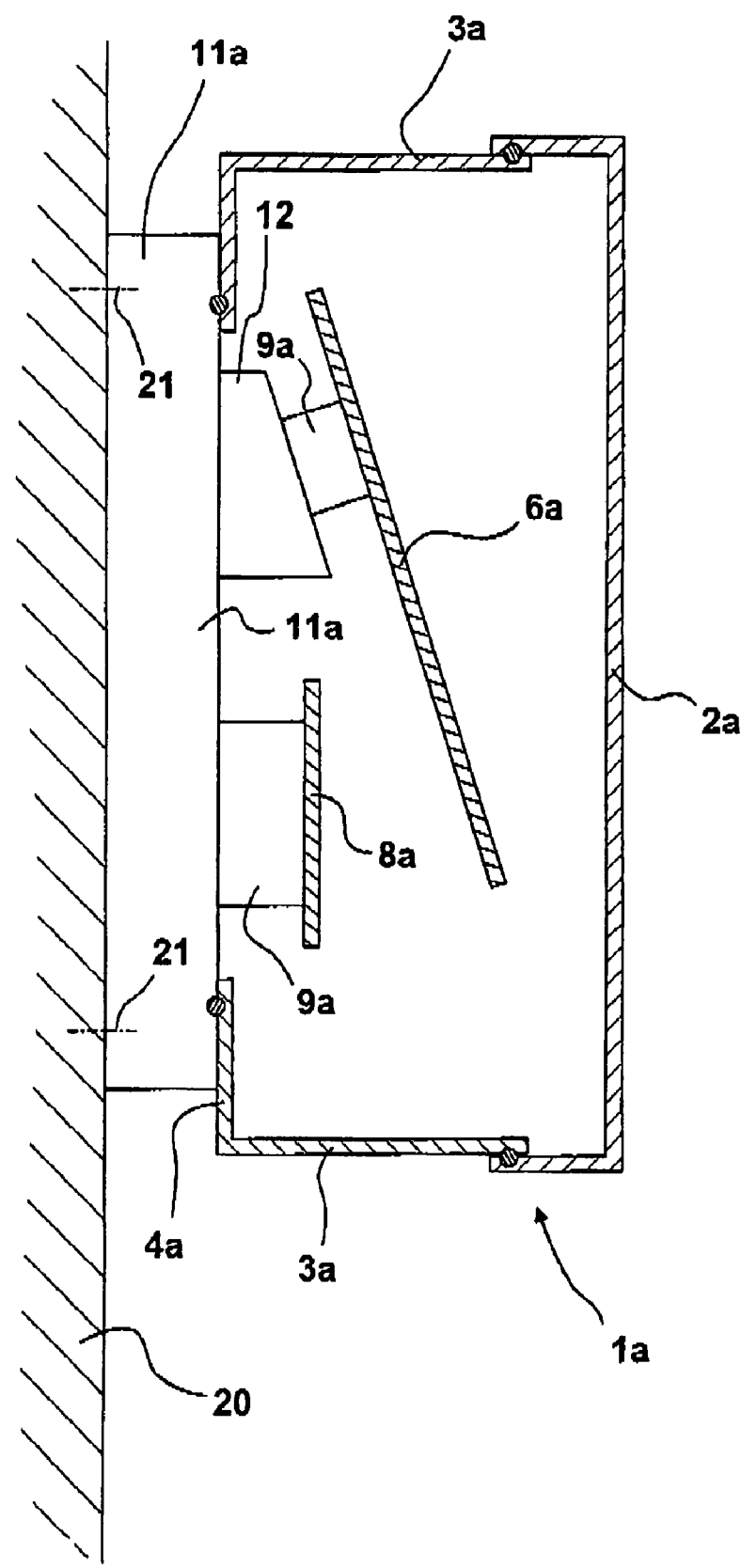
FIG. 3 shows the power inverter housing in a second variant in a side view.

The illustration shown in FIG. 3 shows the second variant, with only the actual housing being shown and not the connection chamber 30, although it is possible to also provide a connection chamber there.

The housing, which is indicated at 1*a*, has a cover 2*a*, walls 3*a* and a bottom 4*a*. The bottom has an opening for receiving the cooling body 11*a*. On the cooling body 11*a*, there is seated a semiconductor component having the printed circuit board 8*a*. This printed circuit board is oriented parallel to the bottom or also to the upper side of the cooling body 11*a*.

The cooling body further exhibits a block-shaped ramp 12 with an inclined top side on which there is mounted a semiconductor component 9*a*. This semiconductor component is oriented at an incline so that the printed circuit board is also inclined, the printed circuit board 8*a* thereby overlapping or protruding in a spaced-apart relationship. Providing for a spacing between the printed circuit boards in the region of the overlap makes sense because of the cooling needed in the housing.

We claim:

1. A power inverter, comprising a housing having a bottom, said bottom of the housing of the power inverter being configured to be stepped, cooling bodies being disposed on the exterior face of the stepped bottom, at least two printed circuit boards that overlap each other and communicate with the respective one of the cooling bodies through semiconductor components being provided.

2. The power inverter as set forth in claim 1, wherein said cooling bodies have a desired height and, wherein height of the cooling bodies for mounting to the stepped bottom is selected so that the cooling bodies form a plane when mounted to the housing.

3. The power inverter as set forth in claim 1, wherein the cooling bodies are arranged laterally offset in the housing when viewed from the front.

4. The power inverter as set forth in claim 1, wherein the printed circuit boards communicate with a respective one of the cooling bodies through semiconductor components.

5. The power inverter as set forth in claim 1, wherein magnetic components are provided which are also cooled by the air flowing through the cooling bodies.

6. The power inverter as set forth in claim 1, wherein the cooling bodies comprise means for fastening to a housing part.

7. The power inverter as set forth in claim 6, wherein the housing comprises a connection region for the cable supply.

8. The power inverter as set forth in claim 7, wherein the connection region comprises at least one pole block with a plurality of terminals.

9. The power inverter as set forth in claim 7, wherein cable passageways are provided and transition is provided from the connection chamber to the housing and is sealed with rubber collars in the region of the cable passageways.

10. The power inverter as set forth in claim 7, wherein the connection region comprises a wall oriented at an incline and has a sealable opening for the cables.

* * * * *